United States Patent [19]
Ibrahim

[11] 3,987,475
[45] Oct. 19, 1976

[54] NONDESTRUCTIVE CHARGE SENSING IN A CHARGE COUPLED DEVICE

[75] Inventor: Abd-El-Fattah Ali Ibrahim, Ottawa, Canada

[73] Assignee: Northern Electric Company Limited, Montreal, Canada

[22] Filed: Nov. 10, 1975

[21] Appl. No.: 630,160

[52] U.S. Cl. .............................. 357/24; 307/221 D; 307/304
[51] Int. Cl.[2] .................. H01L 29/78; H03K 3/353
[58] Field of Search ........... 357/24; 307/221 D, 304

[56] References Cited
UNITED STATES PATENTS

| | | | |
|---|---|---|---|
| 3,758,794 | 9/1973 | Kosonocky | 357/24 |
| 3,918,070 | 11/1975 | Shannon | 357/24 |

OTHER PUBLICATIONS
Ibrahim et al., "CCD's for Transversal Filter Applications" Int. Electron Devices Meeting Tech. Digest (12/74) pp. 240–243.

Primary Examiner—William D. Larkins
Assistant Examiner—Gene M. Munson
Attorney, Agent, or Firm—John E. Mowle

[57] ABSTRACT

A region of opposite conductivity is diffused into the substrate of a charge coupled device adjacent the edge of one of its storage electrodes and the following transfer electrode to provide an improved structure for nondestructively sensing mobile charges being transferred along the device. With this arrangement there is less capacitive coupling between the region and the electrodes and less disruption of the CCD channel which results in a much reduced perturbation of the mobile charges.

4 Claims, 4 Drawing Figures

NONDESTRUCTIVE CHARGE SENSING IN A CHARGE COUPLED DEVICE

BACKGROUND OF THE INVENTION

This invention relates to an improved structure for nondestructively sensing mobile charges in a charge coupled device and more particularly to an improved form of the type which utilizes a region of opposite conductivity to that of the charge storage medium.

In an article entitled: "Charge-Coupled Devices — A New Approach to MIS Device Structure", IEEE Spectrum, July 1971, pp 18–27; W. S. Boyle and G. E. Smith describe a new information-handling structure, the charge coupled device (CCD). The device stores a minority-carrier charge in potential wells created at the surface of a semiconductor and transports the charge along the surface by the application of bias potentials to control electrodes so as to move the potential wells.

In some of these devices, particularly those used for transversal filters and the like, an important aspect is the arrangement used to nondestructively detect the mobile charges as they are transferred along the CCD. Various nondestructive sensing arrangements are known. In one, a localized zone of opposite conductivity type is disposed beneath one of the storage electrodes so as to collect the mobile charge being transferred along the semiconductor substrate from where it is detected by well known means. The disadvantage of this arrangement is that the localized zone tends to disrupt the flow of charge along the device which affects the transfer efficiency therethrough thereby creating a source of noise. Alternate arrangements have been proposed, some of which include floating electrodes which sense the charge being transferred thereunder rather than utilizing the opposite conductivity regions as the sensing source.

STATEMENT OF THE INVENTION

It has been discovered that a significant improvement in the sensing of charge utilizing the diffused region of opposite conductivity type can be obtained if the region is located adjacent the edge of the storage electrode rather than beneath it. In addition, in order to obtain efficient transfer of the charge which enters the diffused area, the latter also extends along the device adjacent at least one following transfer electrode.

Thus, in accordance with the present invention there is provided a sensing structure for a charge coupled device which comprises a charge storage body of one conductivity type having a dielectric layer disposed thereover. In addition, a plurality of storage electrodes interleaved with transfer electrodes are disposed over the dielectric layer for controlling the sequential transfer of mobile charges along the body in response to clock voltages applied thereto. The sensing structure includes a region of opposite conductivity type to that of the body located at the surface thereof, contiguous with and nonoverlapping both one of the storage electrodes and the following transfer electrode. To detect the charge, the structure includes a capacitive input device connected to the region for nondestructively monitoring the mobile charges being transferred along the device.

Such a structure does not require any extra clocks or operating conditions than are required for conventional CCD delay line operation. Because the sensing region is adjacent rather than beneath the storage electrode, capacitive coupling effects are minimized. Additionally, structural alterations to the main channel are confined to edge effects so as to minimize perturbations of the mobile charges being transferred along the CCD. As a result, transfer efficiency is higher and noise introduction lower than the prior structure in which the sensing region is disposed beneath the storage electrodes. This increases the dynamic range of the device. Also it provides a high degree of linearity over a wide range of signal amplitudes.

BRIEF DESCRIPTION OF THE DRAWINGS

An example embodiment of the invention will now be described with reference to the accompanying drawings in which.

DESCRIPTION OF THE PREFERRED EMBODIMENT

Figure 1:
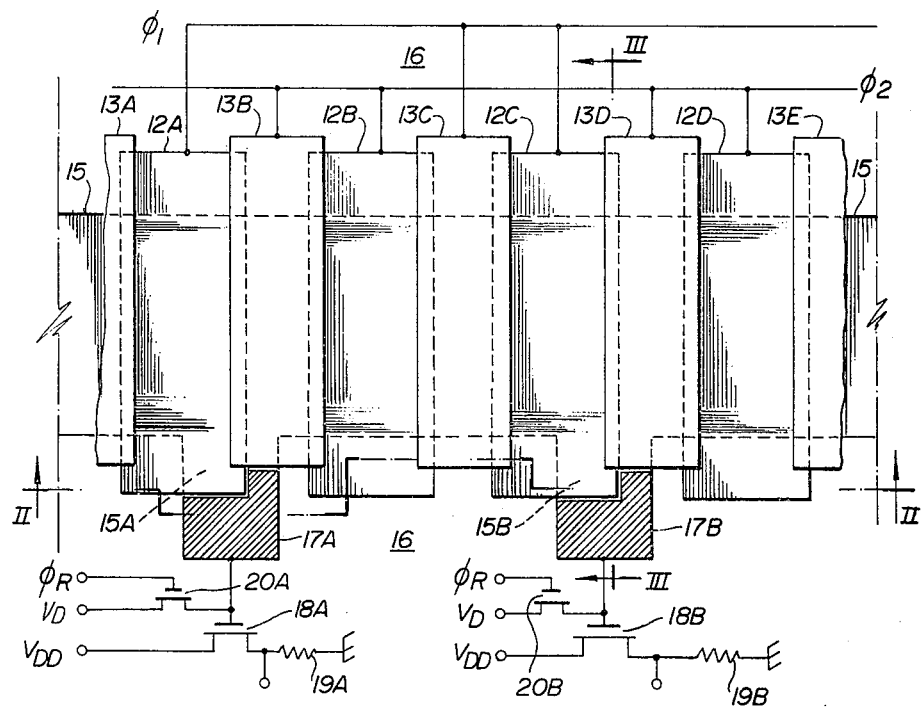
FIG. 1 is a plan view of a portion of a charge coupled device incorporating the sensing structure.

The fabrication of the charge coupled device and its accompanying structure described herein utilizes technologies well established and known in the semiconductor field. It is therefore considered unnecessary to describe in detail the individual steps for forming the device. However, Canadian Pat. No. 941,072 issued Jan. 29, 1974 to James J. White, describes one method of constructing a two-level poly-silicon charge coupled device which is the basic structure of the device disclosed herein. Also, it is evident that the figures shown in the drawings are exemplary of the construction of the invention and are not necessarily drawn to scale.

In the following detailed description and accompanying drawings, basic reference numerals are assigned to individual elements of the device. Where it is necessary to distinguish between repetitive elements in a row, additional reference characters are added to the base number. In general, reference is made only to the base number.

Figure 2:
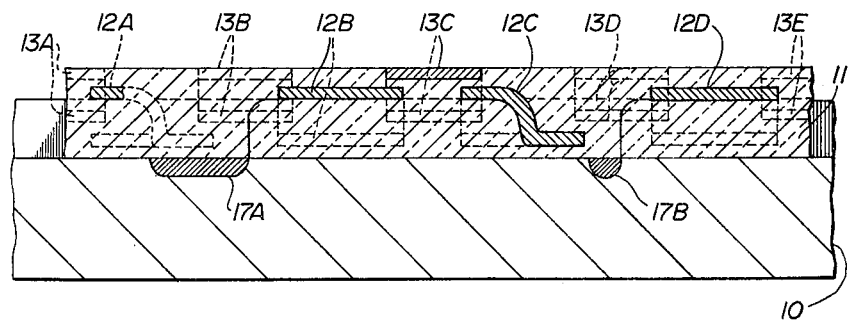
FIG. 2 is a cross-sectional view taken along the line II—II of FIG. 1.
Figure 3:
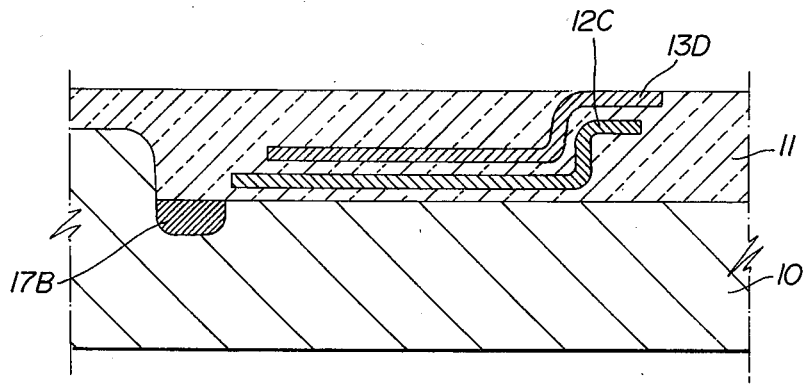
FIG. 3 is a cross-sectional view taken along the line III—III of FIG. 1.
Figure 4:
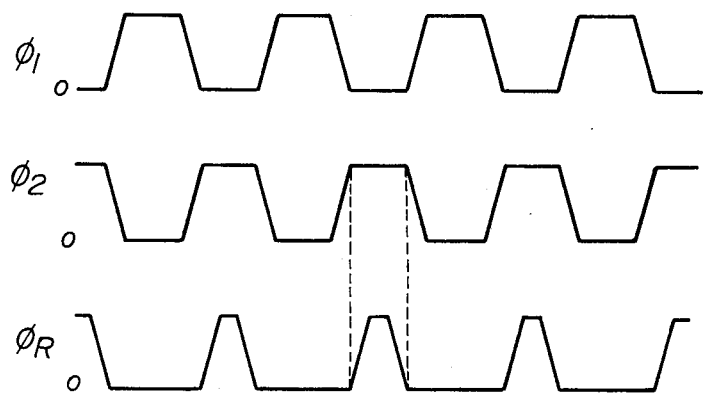
FIG. 4 illustrates typical voltage waveforms of the clock signals applied to the CCD structure.

Referring to FIGS. 1, 2 and 3, the two-phase charge coupled device (CCD) comprises a charge storage body 10 of p-type silicon having a variable thickness silicon dioxide ($SiO_2$) insulating layer 11 thereover. A set of storage electrodes 12 are disposed over the $SiO_2$ layer 11. Interleaved between the storage electrodes 12 are a set of transfer electrodes 13 also disposed on the $SiO_2$ layer 11 and overlapping the electrodes 12. Charge transfer along the device takes place in the gate oxide channel 15 under control of clock voltages $\phi_1$ and $\phi_2$ applied to the electrodes 12 and 13. This gate oxide channel 15 consists of alternating thicknesses of insulating layer 11 which is approximately 1100A thick under the storage electrodes 12 and 3000A thick under the transfer electrodes 13. Along each side the insulating layer 11 has a thickness of about $1.2\mu m$ to form the field oxide regions 16. These latter regions 16 are sufficiently thick that the portions of the semiconductor substrate 10 immediately beneath them do not deplete in response to the application of clock voltages to the electrodes 12 and 13. Consequently, the minority-carrier charges are only carried along the substrate 10 beneath the gate oxide channel 15.

Two $n^+$-type sensing regions 17A and 17B are diffused into the substrate 10 immediately adjacent portions of alternate storage electrodes 12A and 12C, and their following transfer electrodes 13B and 13D respectively. In addition, the gate oxide channel 15 is extended laterally at 15A and 15B to the edges of the sensing region 17A and 17B respectively.

FIG. 1 also illustrates the connections of the electrodes 12 and 13 to the clocks $\phi_1$ and $\phi_2$ to provide conventional two-phase operation of the CCD. In addition, each of the sensing regions 17 is connected to the input of a capacitive input sensing device, or gate of a field effect transistor (FET) 18, the source of which is connected to ground through a load resistor 19 and the drain to an operating voltage $V_{DD}$. Additional reset FETs 20, driven by the clock $\phi_R$ are connected between the sensing regions 17 and a supply voltage $V_D$.

In operation, positive clock voltages $\phi_1$ and $\phi_2$ are alternately applied between the electrodes 12, 13 and the substrate 10, to transfer mobile charges (i.e. electrons) along the depleted region of the substrate 10 in the gate oxide channel 15. When a charge is transferred beneath the storage electrode 12A, a small portion is coupled to the sensing region 17A (which is a floating region) to equilibriate with the surface potential beneath the electrode 12A. The flow of majority carriers into the sensing region 17A causes a change in the transconductance of the FET 18A so that an output is developed across the load resistor 19A. The rise in the clock voltage $\phi_2$ and drop in the clock voltage $\phi_1$ causes the charge beneath the storage electrode 12A to transfer to storage electrode 12B. Because a portion of the sensing region 17A is also in juxtaposition with the transfer electrode 13B substantially all of the carriers in the region 17A are transferred beneath the storage electrode 12B. As a result, perturbation of the charge being transferred along the CCD is minimized and very little noise is introduced into the signal. After transfer of the charge beneath the storage electrode 12B, the sensing region 17A may be reset by the reset voltage $\phi_R$ applied to the gate of the field effect transistor 20A. This virtually eliminates any residual charge left in the sensing region 17A and thus insures an accurate measure of the charges being transferred along the CCD which is essential for analog applications. After successive transfers the charge is again sensed when it is stored beneath the storage electrode 12C in a manner similar to that described with reference to the storage electrode 12A. It should be noted that the reset transistors 20 are optional as it has been found in practice that very little residual charge was left using the structure of the present invention.

The present structure is very suitable for applications where repeated nondestructive sensing of the charges being transferred along the device is required such as in certain types of shift registers. For transversal filter applications, weighting of the charge can be applied externally, or internally utilizing the split electrode technique. Also, while a two-level two-phase device is illustrated, the principles of the invention can be equally applied to a single-level three-phase device by extending the sensing region to the following storage electrode.

What is claimed is:

1. A structure for nondestructively sensing charge in a charge coupled device comprising:
   a charge storage body of one conductivity type;
   a dielectric layer disposed over the body;
   a plurality of storage electrodes interleaved with transfer electrodes disposed over the dielectric layer for controlling the sequential transfer of mobile charges along said charge storage body in response to clock voltages applied thereto;
   the structure comprising:
   a region of opposite conductivity type at the surface of said body contiguous with and non-overlapping both one of said storage electrodes and a following one of said transfer electrodes; and
   capacitive input monitor means, connected to said region for nondestructively monitoring the mobile charges transferred to the region as they are being transferred along the device.

2. A structure for nondestructively sensing charge in a charge coupled device comprising:
   a semiconductor substrate of one conductivity type;
   a dielectric layer disposed over the substrate having a gate oxide channel encompassed by field oxide regions;
   a plurality of lower level storage electrodes interleaved with higher level transfer electrodes disposed over the gate oxide channel for controlling the sequential transfer of mobile charges along the adjacent surface of said substrate in response to clock voltages applied thereto;
   the structure comprising:
   a region of opposite conductivity type at said surface of said substrate contiguous with and non-overlapping both one of said storage electrodes and a following one of said transfer electrodes; and
   a field effect transistor having its gate electrode connected to said opposite conductivity region, and its source and drain electrodes connected in series with a load resistor to a source of operating voltage, to monitor the mobile charges being transferred along the device across the load resistor.

3. A structure as defined in claim 2 which additionally includes a further field effect transistor having its source and drain connected between said opposite conductivity region and said source of operating voltage and its gate connected to a further clock for removing any residual charge after transfer from said region.

4. A structure as defined in claim 3 in which the opposite conductivity regions are displaced laterally from the sides of the gate oxide channel and the channel is extended laterally to meet said region.

* * * * *